US012439480B2

(12) United States Patent
Inoue

(10) Patent No.: US 12,439,480 B2
(45) Date of Patent: Oct. 7, 2025

(54) HEATING LIGHT SOURCE DEVICE, HEATING LIGHT SOURCE MODULE AND OPTICAL HEATING SYSTEM

(71) Applicant: Ushio Denki Kabushiki Kaisha, Tokyo (JP)

(72) Inventor: Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 913 days.

(21) Appl. No.: 17/668,243

(22) Filed: Feb. 9, 2022

(65) Prior Publication Data

US 2022/0361292 A1 Nov. 10, 2022

(30) Foreign Application Priority Data

May 7, 2021 (JP) .................................. 2021-078972

(51) Int. Cl.
*H05B 3/00* (2006.01)
*F21V 29/83* (2015.01)
(Continued)

(52) U.S. Cl.
CPC ........... *H05B 3/0047* (2013.01); *F21V 29/83* (2015.01); *H05B 3/02* (2013.01); *H01L 21/67115* (2013.01); *H05B 2203/032* (2013.01)

(58) Field of Classification Search
CPC ......... F21V 29/83; H05B 3/0047; H05B 3/02; H05B 2203/032; H01L 21/67115; H01L 21/67109
See application file for complete search history.

(56) References Cited

U.S. PATENT DOCUMENTS 8,897,631 B2 * 11/2014 Kasai ................ H01L 21/67115
392/407

FOREIGN PATENT DOCUMENTS

JP H08227953 A * 9/1996 ............... G21K 1/10
JP 2004294970 A * 10/2004
(Continued)

OTHER PUBLICATIONS

Ozawa, English translation of JP2015072747A (Year: 2015).*
(Continued)

*Primary Examiner* — Steven W Crabb
*Assistant Examiner* — Ellen Halverson Grzegorzewski
(74) *Attorney, Agent, or Firm* — Yoshida & Associates LLC; Kenichiro Yoshida

(57) ABSTRACT

A heating light source device includes a plurality of heating light source modules; each of the heating light source modules includes; a light-emitting element substrate having a placement surface and a back side surface, the back side surface being opposite to the placement surface; a plurality of light-emitting elements mounted on the placement surface; and a cooling member being in contact with the back side surface and including a cooling channel formed inside the cooling member and that communicates cooling medium for cooling the light-emitting elements, an inlet port that introduces the cooling medium into the cooling channel, an outlet port that discharges the cooling medium to the outside of the cooling member; and the cooling channel has a spiral shape being gradually from a center portion side of the light-emitting element substrate to a circumferential edge portion side thereof when viewed from a direction orthogonal to the placement surface.

12 Claims, 7 Drawing Sheets

(51) Int. Cl.
    *H01L 21/67*    (2006.01)
    *H05B 3/02*    (2006.01)

(56) References Cited

FOREIGN PATENT DOCUMENTS

| JP | 2010129861 A | * | 6/2010 | ....... H01L 21/67098 |
|---|---|---|---|---|
| JP | 2011064929 A | * | 3/2011 | ............. F21V 29/56 |
| JP | 2011222624 A | * | 11/2011 | ........... H01L 23/473 |
| JP | 2015072747 A | * | 4/2015 | |
| JP | 2016-58722 A | | 4/2016 | |
| JP | 6558222 B2 | | 5/2017 | |
| JP | 2019061819 A | * | 4/2019 | |

OTHER PUBLICATIONS

Yokogawa, English translation of JP2019061819A (Year: 2019).*
Arima, English translation of JP2004294970A (Year: 2004).*
Yamamoto, English translation of JPH08227953A (Year: 1996).*
Sagawa, English translation of JP2011222624A (Year: 2011).*
Yano, English translation of JP2011064929A (Year: 2011).*
Yoneda, English translation of JP2010129861A (Year: 2010).*

* cited by examiner

HEATING LIGHT SOURCE DEVICE, HEATING LIGHT SOURCE MODULE AND OPTICAL HEATING SYSTEM

TECHNICAL FIELD

The present invention relates to light source devices, and more particularly relates to a heating light source device for heating a workpiece with optical irradiation, a heating light source module that is mounted thereon and an optical heating system using the light source device.

BACKGROUND ART

Semiconductor manufacturing process involves various heat treatments including film forming treatment, oxidation diffusion treatment, modification treatment, and annealing treatment on workpieces, such as semiconductor wafers. These treatments often use a heat treatment method with optical irradiation that enables non-contact treatment. The following Patent document 1 discloses a heating device that performs heat treatment on silicon wafers by irradiating the surfaces of semiconductors to be treated with light for heating.

CITATION LIST

Patent Document

Patent Document 1: JP-A-2016-058722

SUMMARY OF INVENTION

Technical Problem

The semiconductor manufacturing processes has involved various processes recently. Suppose treatment equipment used in each step of each process is introduced individually, huge installation costs and a vast amount of space to install the equipment is required. Hence, the treatment equipment that can handle treatment steps of multiple processes in a single device is required. Heat treatment equipment is also expected to handle multiple processes in a single device.

One of factors that determines the design of a heat treatment device include a size of the workpiece. A silicon wafer as the workpiece commonly has, for example, a size of $\varphi 200$ mm or $\varphi 300$ mm.

Conventional heat treatment devices are configured to be provided with a plurality of light-emitting elements arranged in predetermined positions on a single substrate to perform heat treatment evenly on a workpiece having a specific size to be treated. Even these heat treatment devices can perform heat treatment on a workpiece as long as it is smaller than that having the originally specified size because the workpiece is entirely irradiated with light for heating (hereinafter referred to heating light) emitted from the light-emitting elements.

Unfortunately, heat treatment devices are generally optimized for configuration including the shape of supporters and the arrangement density of light-emitting elements to perform heat treatment evenly on workpieces having a specific size only. Hence, in the case of workpieces having sizes other than the originally specified, the heat treatment devices may unevenly heat the workpieces, making it difficult to be readily applicable to workpieces having sizes other than the originally specified.

The above-mentioned Patent Document 1 discloses a heat treatment device in which a plurality of light-emitting element units, each of which is sufficiently small compared to a silicon wafer, are arranged on a support plate that serves as a base having a size equivalent to the silicon wafer. The heat treatment device of this configuration appropriately enables the arrangement pattern of the light-emitting element units on the support plate to be modified to suppress unevenness in the heat treatment in accordance with the size of the silicon wafer.

However, the heat treatment device, which simply combines a plurality of light-emitting element units, is not intended to move or modify a cooling mechanism for cooling the light-emitting elements in response to the movement of the light-emitting element units. Hence, the light-emitting element units are often not cooled as much as expected when the position of their arrangement is modified.

Semiconductor light-emitting devices, such as LED devices, have a property of decreasing brightness as the temperature rises. Hence, when the support plate on which the light-emitting element units are arranged has a different cooling performance in different areas, light-emitting element units that are sufficiently cooled and light-emitting element units that are insufficiently cooled are mixed together, resulting in difference in temperature at each of the light-emitting element units. The difference in temperature at each of the light-emitting element units cause a difference in brightness at each of the light-emitting element units, leading to uneven irradiation of the heating light irradiated onto the irradiated surface of the workpiece.

Thus, the arrangement of the light-emitting element units mounted on the heat treatment device has not been substantially modified as desired.

The present invention is made in consideration of the above issues, and it is an object of the present invention to provide a heating light source device, a heating light source module and optical heating system that are used for heat treatment of a workpiece having a various sizes and shapes, and that also suppresses uneven irradiation onto the irradiated surface of the workpiece.

Solution to Problem

A heating light source device according to the present invention includes a plurality of heating light source modules, each of the heating light source modules includes;

a light-emitting element substrate having a placement surface and a back side surface, the back side surface being opposite to the placement surface;

a plurality of light-emitting elements mounted on the placement surface of the light-emitting element substrate; and a cooling member having a first main surface on which the light-emitting element substrate is disposed and is in contact with the back side surface of the light-emitting element substrate, and a second main surface that is located opposite to the first main surface; and including a cooling channel that is formed inside the cooling member and that communicates cooling medium for cooling the light-emitting elements, an inlet port that introduces the cooling medium into the cooling channel, an outlet port that discharges the cooling medium from the cooling channel to outside the cooling member;

wherein the cooling channel has a spiral shape being gradually from a center portion side of the light-emitting element substrate to a circumferential edge portion side thereof when viewed from a direction orthogonal to the first main surface of the cooling member.

In the present specification, the term "contact" between the light-emitting element substrate and the cooling member includes the case in which the light-emitting element substrate and the first main surface of the cooling member are directly in contact with each other, as well as cases in which they are disposed to be in thermal contact via grease or a highly thermally conductive sheet to enhance thermal conductivity.

In the above-mentioned configuration, when the heating light source module is moved to modify the position of arrangement of the heating light source module, the cooling member provided at the heating light source module moves along with the light-emitting element substrate, thereby the light-emitting element substrate is consistently cooled by the specific cooling member. Hence, the light-emitting elements mounted on the heating light source module receive sufficient cooling performance wherever the heating light source module is moved, enabling the light-emitting elements being lit with a desired brightness. Therefore, the above-mentioned heating light source device performs heat treatment uniformly on the entire workpiece since the heating light source modules for the workpiece suppresses the difference in irradiation of the heating light irradiated onto the workpiece.

According to the above heating light source device, the cooling member includes a cutout or a through hole that communicates the first main surface with the second main surface with at least one location. The heating light source module may include a power feeder through which the light-emitting elements are powered, the power feeder being inserted through the cutout or the through hole.

The power feeder for supplying a current to the light-emitting elements is routed on the second main surface side, not on the first main surface side, on which the light-emitting elements are arranged, so as to prevent the heating light, which is emitted from the light-emitting elements and is irradiated onto the workpiece, from being blocked.

However, connecting the power feeder to the light-emitting element substrate, which is disposed on the first main surface of the cooling member, requires the power feeder to be drawn out from the second main surface side of the cooling member to the first main surface side thereof in a vicinity of the heating light source module, in which the light-emitting element substrate to be connected is mounted.

In the case in which a sufficient space for allowing the power feeder to pass through is secured between adjacent heating light source modules disposed on the frame, the power feeder is drawn out to the first main surface side of the cooling member through the space. However, as described above, arranging the heating light source modules closely together causes the gap between the heating light source modules to be very narrow, making it difficult to secure the space for allowing the power feeder to be drawn out from the second main surface side of the cooling member to the first main surface side thereof.

Hence, the above-mentioned configuration allows the heating light source device to arrange the heating light source modules closely as well as to secure the space for allowing the power feeder to be drawn out from the second main surface side of the cooling member to the first main surface side thereof in a vicinity of the respective heating light source modules.

It is noted that the cutout or the through hole may be provided at one location, and two power feeders that are connected to electrodes provided at the light-emitting substrate may pass through the same cutout or the through hole. However, the cutout or the through hole is preferably provided at two locations in the cooling member from the standpoint of preventing short circuits and leakage currents from occurring between the power feeder connected to the positive electrode and the power feeder connected to the negative electrode.

The cooling member may be further provided with cutouts and through holes for other purposes in addition to the cutouts and through holes for drawing out the power feeder.

The above heating light source device may include a frame having a main surface on which a plurality of the heating light source modules are mounted and an adjustment mechanism that adjusts at least either of the position of the light-emitting element substrate in a direction orthogonal to the main surface of the frame and a tilt angle of the placement surface of the light-emitting element substrate relative to the main surface of the frame.

The above configuration allows the irradiance of the irradiated heating light to be adjusted appropriately for each area on the irradiated surface of the workpiece in accordance with the size and shape of the workpiece.

In the above heating light source device, the cooling member may be configured to have a triangular shape, a quadrangular shape, a pentagonal shape, or a hexagonal shape when viewed from a direction orthogonal to the first main surface of the cooling member.

The above configuration enables the heating light source modules to be arranged more closely. It is noted that the heating light source device and the heating light source modules according to the present invention are assumed to be used mainly for the heat treatment of silicon wafers. Hence, when the heat treatment is performed on the workpiece whose irradiated surface is circular, such as a silicon wafer, the irradiance distribution of the heating light on the irradiated surface is preferably concentric on the irradiated surface of the workpiece.

In the case described above, in the heating light source device, the heating light source modules are preferably arranged in the form of concentric circles when viewed toward the surface on which the light-emitting elements of the light-emitting element substrate are mounted. And from the viewpoint of implementing the arrangement configuration and facilitating the close arrangement, the heating light source module is preferably configured to have a hexagonal shape, which is closer to a circular shape than a triangular or quadrangular shape, when viewed from a direction orthogonal to the first main surface of the cooling member.

In the above heating light source device, the cooling member may include a reflective area that is formed at least on a part of the first main surface of the cooling member, other than the place on which the light-emitting element substrate is mounted.

In addition, in the above heating light source device, the reflective area may be formed with an inorganic particle layer.

The above configuration allows a part of the heating light that is reflected by the irradiated surface of the workpiece toward the light source module side to be reflected to travel toward the workpiece side again. Hence, at least a part of the heating light reflected back toward the light source module side can be reused as heating light to heat the workpiece, improving the heating efficiency.

In the above heating light source device, the cooling channel may be configured such that the entire cooling channel faces the light-emitting element substrate with respect to a direction orthogonal to the first main surface of the cooling member.

The above configuration suppresses the heat generated by each of the light-emitting elements from diffuse in the direction parallel to the first main surface of the cooling member, thus the heat is absorbed by the cooling medium flowing through the cooling channels sequentially, improving the cooling efficiency.

In the above heating light source device, the cooling channel may have a channel width that satisfies the following formula (1) when viewed from a direction orthogonal to the first main surface of the cooling member.

$$1 \text{ mm} \leq w \leq c+2d \tag{1}$$

where w is the channel width, c is an average length of one sides of the plurality of the light-emitting elements, each of the one sides being defined as equal to or longer than the other side thereof, and d is a separation distance between the first main surface of the cooling member and the cooling channel with respect to a direction orthogonal to the first main surface of the cooling member.

When the cooling channel is formed such that the cooling medium gradually flows from the center portion side of the substrate to the circumferential edge portion side thereof while spiraling around the center of the substrate, the cooling channel is preferably formed around the center of the substrate along the arrangement pattern of the light-emitting elements to cool each of the light-emitting elements arranged on the substrate.

Even when the cooling channel is configured to have a large channel surface area, if the cooling channel is located too far from the light-emitting elements, the thermal resistance of the cooling member has a larger influence, decreasing the cooling performance. Hence, the surface area of the cooling channel, especially the channel width w of the cooling channel, is preferably determined in consideration of the separation distance d between the cooling channel and first main surface of the cooling member.

The width to which the heat generated by the light-emitting elements diffuses inside the cooling member when reaching the cooling channel will be described in the "DESCRIPTION OF EMBODIMENTS" with reference to FIG. 8b. The width is c+2d when the heat is assumed to be isotropically diffused inside the cooling member. Hence, the channel width of the cooling channel is preferably c+2d or less in order to average the temperature distribution in the area on which the light-emitting elements are arranged. Also, the cooling channel is particularly preferably formed directly under the light-emitting elements to improve the cooling performance.

However, forming a cooling member having a very narrow cooling channel with a width of less than 1 mm requires processing equipment and processing technology capable of high-precision processing, increasing the manufacturing cost. Hence, in order to reduce the manufacturing cost and to achieve efficient cooling, the width w of the cooling channel is preferably within the range shown in the above formula (1).

The heating light source module according to the present invention is a heating light source module that is mounted on the above heating light source device.

The optical heating system according to the present invention that performs heat treatment on a workpiece, the optical heating system includes a chamber that accommodates the workpiece, a supporter that supports the workpiece in the chamber, and the heating light source device that emits heating light and that is disposed such that the heating light is irradiated onto an irradiated surface of the workpiece.

In the above optical heating system, the supporter may include a rotation mechanism that rotates the workpiece around an axis passing through the center of the supporter in a direction orthogonal to the irradiated surface of the workpiece.

The above configuration allows the heating light emitted from each of the light-emitting elements to be irradiated onto the irradiated surface of the workpiece that is rotating. Therefore, the temperature distribution on the irradiated surface of the workpiece during the heat treatment is made uniform in its circumferential direction.

Advantageous Effects of Invention

The present invention provides a heating light source device, a heating light source module, and an optical heating system that are capable of using for heat treatment of workpieces having various sizes and shapes, and that suppress uneven irradiation onto the irradiated surface of the workpieces.

DESCRIPTION OF EMBODIMENTS

Hereinafter, embodiments of a heating light source device, a heating light source module, and an optical heating system according to the present invention will now be described with reference to the drawings. It is noted that each of the following drawings related to the heating light source device, the heating light source module and optical heating system is merely schematically illustrated. The dimensional ratios and the number of parts on the drawings do not necessarily match the actual dimensional ratios and the actual number of parts.

Optical Heating System 1

Figure 1:
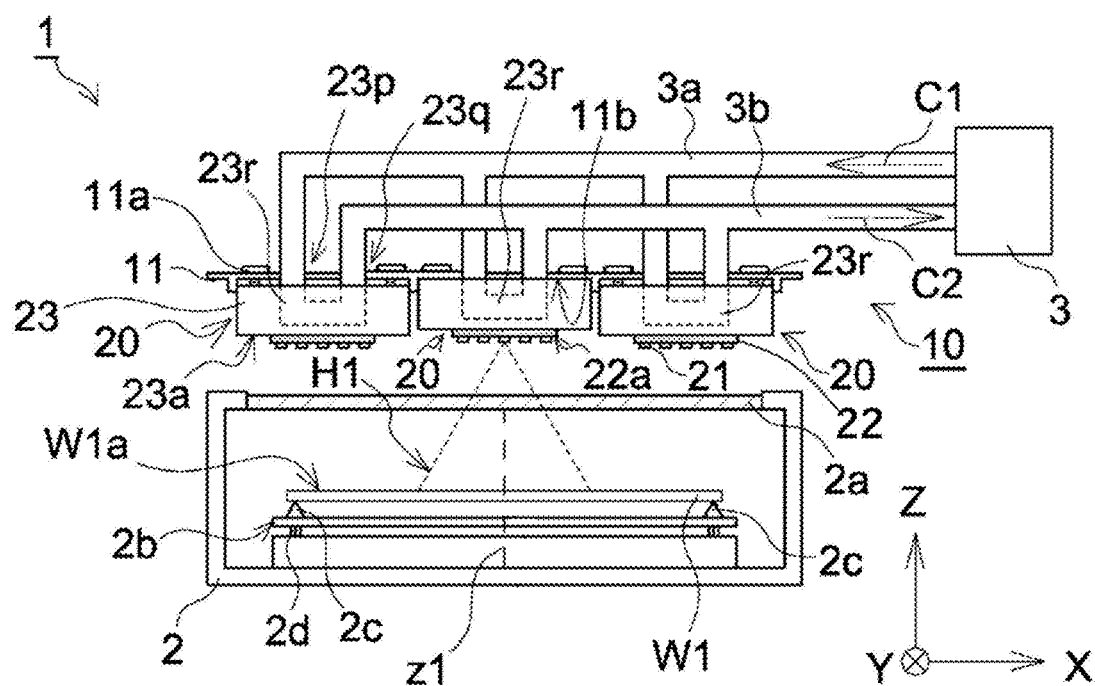
FIG. 1 is a schematic cross-sectional view illustrating an embodiment of an optical heating system when viewed in the Y direction.
Figure 2:
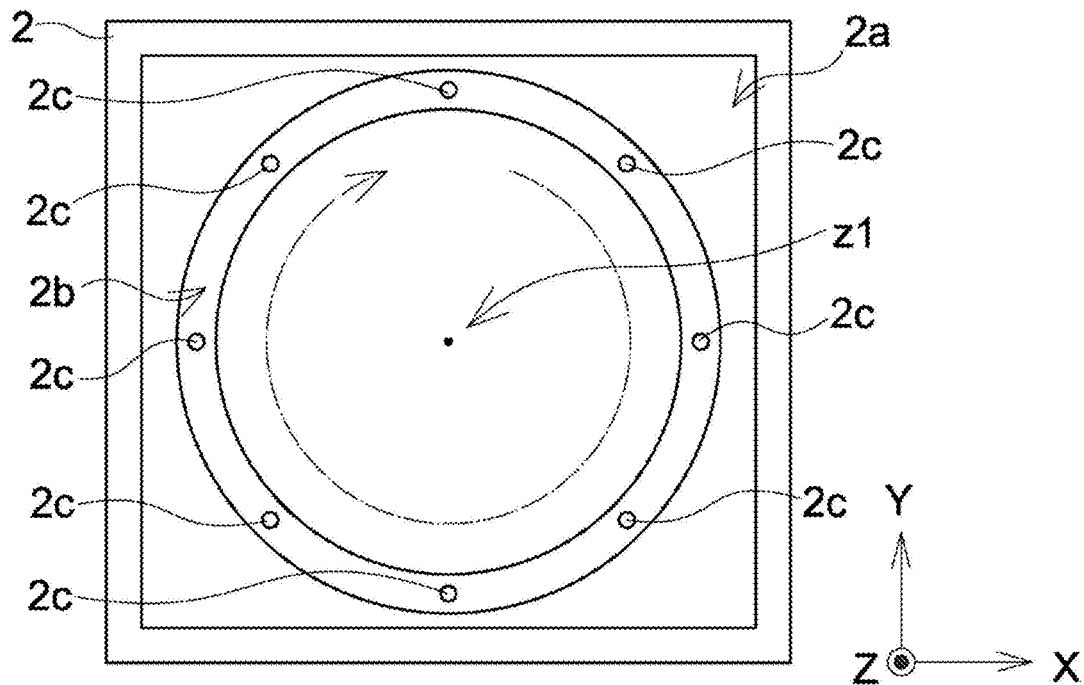
FIG. 2 is a drawing of a chamber in FIG. 1 when viewed from the +Z side.

FIG. 1 is a schematic cross-sectional view illustrating an embodiment of an optical heating system 1 when viewed in the Y direction. FIG. 2 is a drawing of a chamber 2 in FIG. 1 when viewed from the +Z side. As shown in FIG. 1, the optical heating system 1 includes a heating light source device 10, the chamber 2 in which a workpiece W1 is accommodated, a cooling mechanism 3, a first main channel 3a, and a second main channel 3b.

Figure 3:
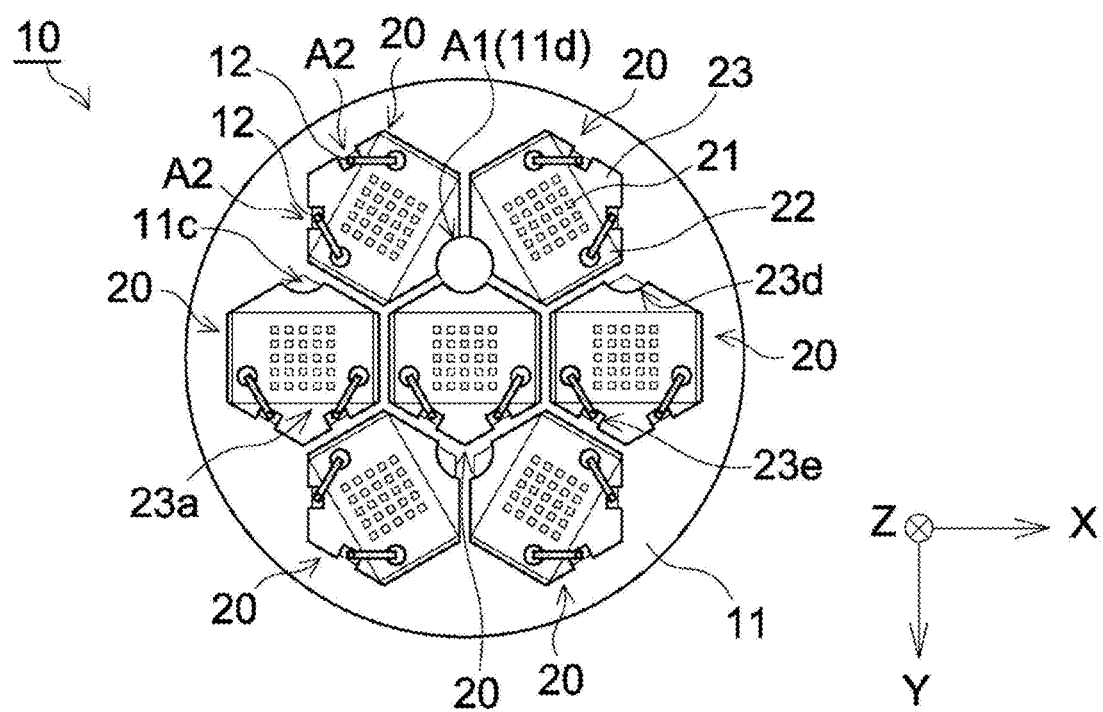
FIG. 3 is a drawing of the heating light source device in FIG. 1 when viewed from the −Z side.
Figure 4:
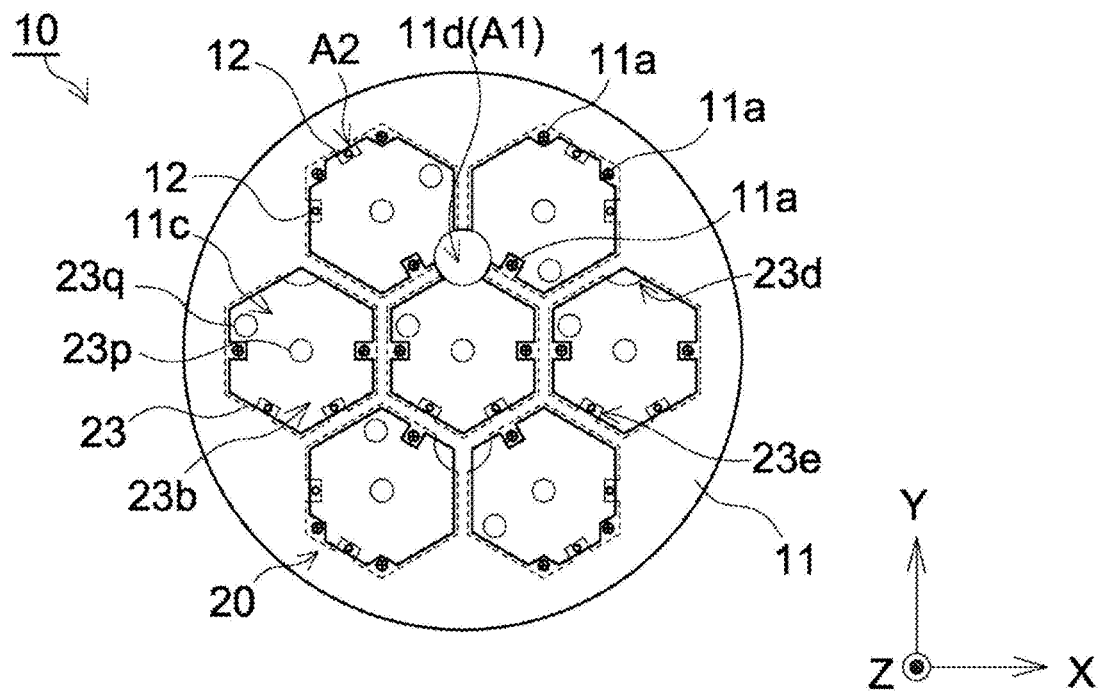
FIG. 4 is a drawing of the heating light source device in FIG. 1 when viewed from the +Z side.

FIG. 3 is a drawing of the heating light source device 10 in FIG. 1 when viewed from the −Z side. FIG. 4 is a drawing of the heating light source device 10 in FIG. 1 when viewed from the +Z side. As shown in FIG. 3, the heating light source device 10 according to the present embodiment includes a plurality of heating light source modules 20 and a frame 11. For the convenience of explanation, a part of the outer edges of the heating light source modules 20, which are arranged on the −Z side of the frame 11 and hidden by the frame 11, are illustrated with dashed lines in FIG. 4.

Figure 5:
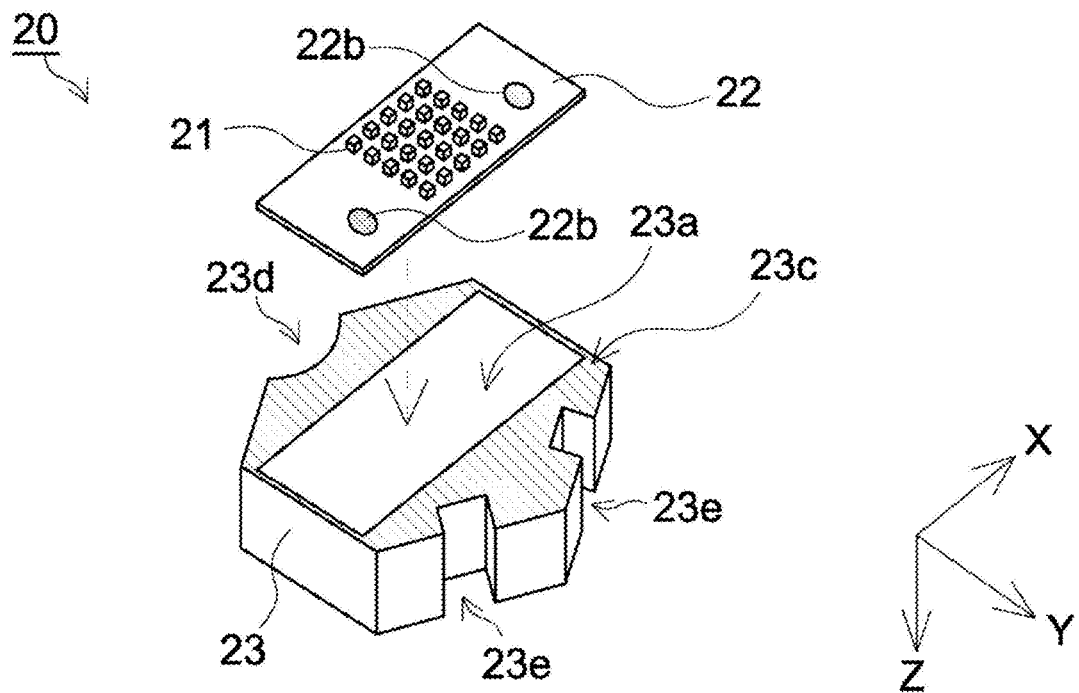
FIG. 5 is an overall perspective view of one heating light source module in FIG. 1.
Figure 6:
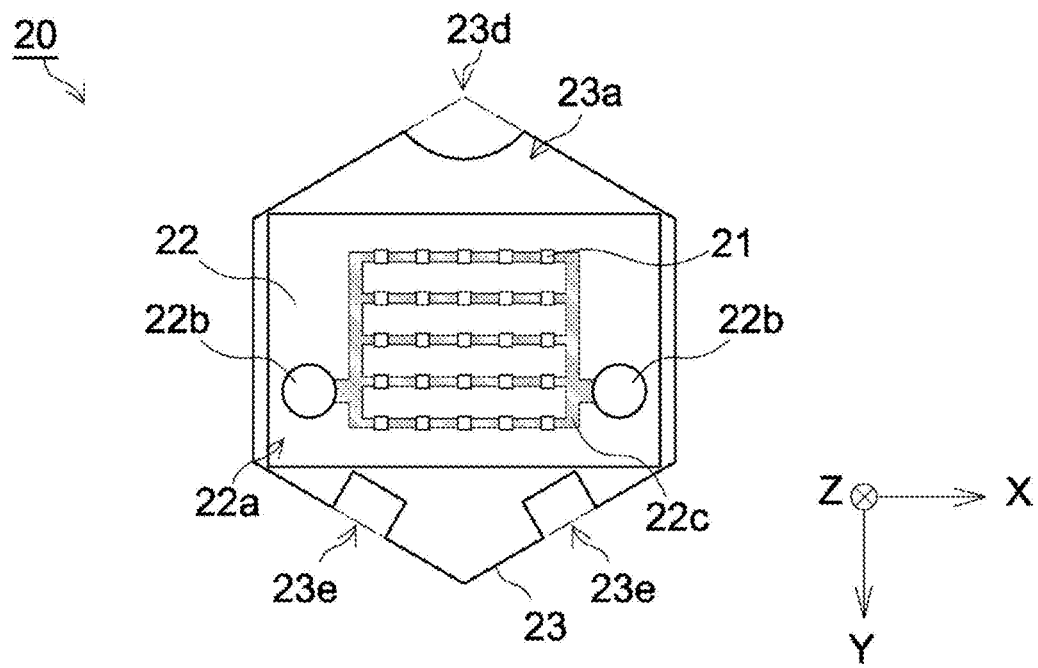
FIG. 6 is a drawing of the one heating light source module when viewed from −Z side.
Figure 7:
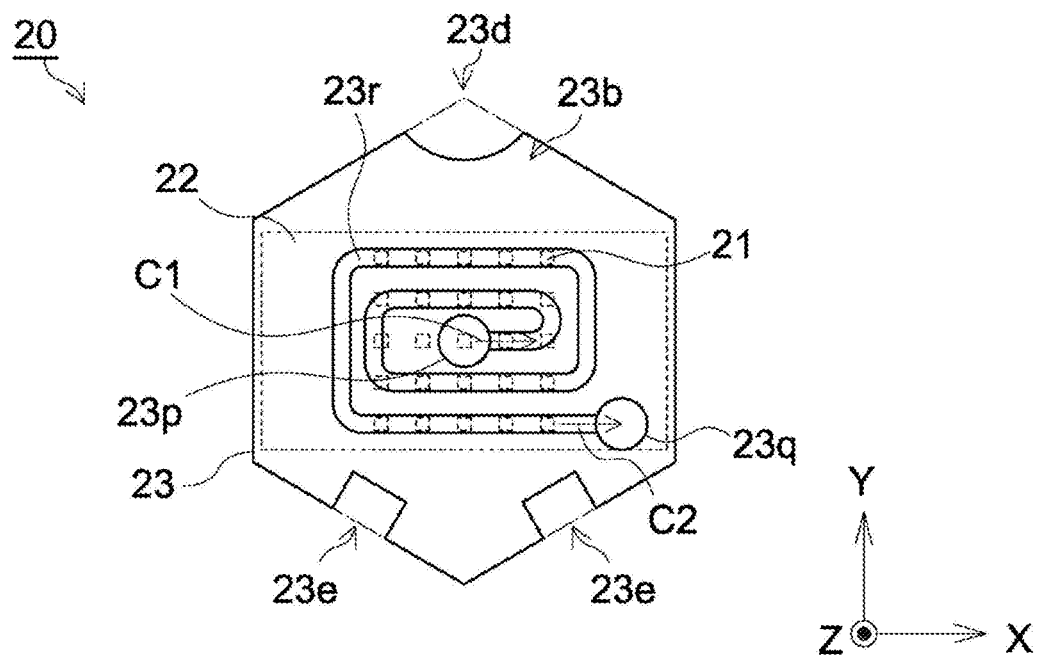
FIG. 7 is a drawing of the one heating light source module when viewed from +Z side.

FIG. 5 is an overall perspective view of the one heating light source module 20 in FIG. 1. FIG. 6 is a drawing of the heating light source module 20 when viewed from −Z side. FIG. 7 is a drawing of the heating light source module 20 when viewed from +Z side. As shown in FIG. 5, the heating light source module 20 according to the present embodiment includes a plurality of light-emitting elements 21, a light-emitting element substrate 22, and a cooling member 23. For the convenience of explanation, the light-emitting element substrate 22 and the cooling member 23 are shown in a separated state in FIG. 5. For the convenience of explanation, the light-emitting elements 21 and the light-emitting element substrate 22, which are disposed on the −Z side of the cooling member 23 and are actually invisible, are illustrated with dashed lines in FIG. 7.

In the following explanation, the direction in which the heating light source device 10 and the workpiece W1 face each other is denoted as the Z direction, and the plane orthogonal to the Z direction is denoted as the XY plane, as shown in FIG. 1. When the structure of the one heating light source module 20 is described, for the convenience of explanation, the light-emitting elements 21 are assumed to be arranged in the X and Y directions, and a direction that an electrode 22b that will be described later and provided in the light-emitting substrate 22 faces is set to the X direction.

Moreover, in the case of expressing a direction that distinguishes a positive direction from a negative direction, a positive or negative sign is assigned to the direction, such as "+Z direction" or "−Z direction". In the case of expressing a direction without distinguishing a positive direction from a negative direction, the direction is simply expressed as "Z direction".

As shown in FIG. 1, the chamber 2 is provided with a light-transmissive window 2a to allow heating light H1 emitted from the heating light source device 10 to enter inside. The chamber 2 is provided with a supporter 2b that supports the workpiece W1, which is an irradiated target, so that the heating light H1 entering through the light-transmissive window 2a is irradiated onto the irradiated surface W1a of the workpiece W1.

The supporter 2b is provided with a plurality of protrusions or projections 2c, as shown in FIGS. 1 and 2, and the workpiece W1 is disposed on the tips of the projections 2c and supported on them.

As shown in FIG. 1, the supporter 2b in the present embodiment includes a rotation mechanism using a plurality of rollers 2d. In the case of performing of heat treatment, the workpiece W1 is rotated on the XY plane around the axis z1, which passes the center of the supporter 2b in the Z direction, as shown in FIG. 2.

As shown in FIG. 1, the first main channel 3a is a channel for directing cooling medium C1 supplied from the cooling mechanism 3 to each of the cooling members 23 of the heating light source module 20; and the second main channel 3b is a channel for discharging cooling medium C2 from the cooling members 23 after flowing through each of the cooling members 23 of the heating light source module 20.

Heating Light Source Device 10

Next, the details of the heating light source device 10 provided in the optical heating system 1 according to the present embodiment will be explained. The heating light source device 10 according to the present embodiment is disposed to emit the heating light H1 toward the chamber 2 located on the −Z side, as shown in FIG. 1. The heating light H1 emitted from the heating light source device 10 is irradiates onto the irradiated surface W1a of the workpiece W1, which is supported by the support members 2b, through the light-transmissive window 2a of the chamber 2.

The frame 11 according to the present embodiment is a disc plate having a circular shape when viewed in the Z direction, as shown in FIG. 3, and is made of aluminum. The frame 11 may be made of, for example, stainless steel, instead of aluminum. The frame 11 may have a shape other than circular, such as an elliptical or polygonal shape when viewed in the Z direction.

As shown in FIG. 3, the frame 11 is provided with an opening 11c that is smaller than the cooling member 23 shown in FIG. 4 such that the opening prevents the heating light source module 20 from moving through the opening, and allows an inlet port 23p and an outlet port 23q that are disposed at the cooling member 23 provided at the heating light source module 20 to communicate with the first main channel 3a and the second main channel 3b when the heating light source module 20 has been disposed on the main surface 11b of the frame 11.

The frame 11 according to the present embodiment has a hole 11d formed across a plurality of the openings 11c, as shown in FIG. 4. As shown in FIG. 3, the hole 11d is provided to communicate with a through-hole area A1 that is formed by combining a plurality of cutouts 23d, which will be described later and provided in the cooling member 23 of the heating light source module 20. The through-hole area A1 and the hole 11d can be used, for example, as an observation window for observing the temperature of the irradiated surface W1a of the workpiece W1 with a non-contact thermometer, such as a radiation thermometer, from the +Z side of the heating light source device 10, or as an inlet port for treatment gas.

In addition, the frame 11 in the present embodiment is provided with an adjustment screw 11a that corresponds to an adjustment mechanism for adjusting the position of the light-emitting element substrate 22 (see FIG. 3) of the heating light source module 20 in the Z direction, as shown in FIG. 1.

A plurality of the adjustment screws 11a in the present embodiment are provided for each of the heating light source module 20. Adjusting each of the screws 11a with twisting individually enables the tilt angle between the placement surface 22a of the light-emitting element substrate 22 of the heating light source module 20 and the main surface 11b (XY plane) of the frame 11 to be adjusted.

The frame 11 in the present embodiment is provided with a plurality of the adjustment screws 11a for adjusting the position and the tilt angle of the heating light source module 20 in the Z direction; however, the frame 11 may be provided with only the one adjustment screw 11a. In addition, the frame may be provided with no adjustment screws 11a, and configured that only the heating light source module 20 is mounted thereon.

Heating Light Source Module 20

Next, the heating light source module 20 provided in the optical heating system 1 according to the present embodiment will be described in detail.

Light-Emitting Element 21

The light-emitting element 21 in the present embodiment is a surface-mounted LED element with a square shape when viewed in the Z direction and has a size of 1 mm square (the term "mm square" indicates the length of one side of the square. The same is applied hereinafter.) The light-emitting element 21 typically has a wavelength of 365 nm to 405 nm.

The light-emitting element 21 may be, for example, an LED element having a size of 1.4 mm square or 2 mm square; it may also be an LED element having a rectangular shape when viewed in the Z direction. Furthermore, the light-emitting element 21 may be an LED element other than a surface-mounted type, or a light-emitting element other than an LED element, for example, an LD element, a fluorescent element, as long as it can be used for the heat treatment of the workpiece W1.

Light-Emitting Element Substrate 22

The light-emitting element substrate 22 is disposed in contact with the first main surface 23a of the cooling member 23, as shown in FIG. 1. The heating light source module 20 in the present embodiment is provided with one light-emitting element substrate 22 that is disposed on one cooling member 23, as shown in FIG. 6.

The light-emitting element substrate 22 is provided with a plurality of the light-emitting elements 21 that are arranged in the X and Y directions on the placement surface 22a thereof, as shown in FIG. 6. The light-emitting elements 21 are connected with wiring 22c to form series-parallel connections between a pair of electrodes (22b, 22b). In the present embodiment, the light-emitting elements 21, which are arranged on the placement surface 22a of the light-emitting element substrate 22, have a pitch of 2 mm in both the X and Y directions.

In order to achieve a high-power heating light source module 20 for the heat treatment of the workpiece W1, the light-emitting elements 21 are necessary to be arranged in a narrow pitch and high density; specifically the light-emitting elements 21 are preferably to be arranged in a pitch of 3 mm or less.

The light-emitting element substrate 22 in the present embodiment employs a substrate made of aluminum nitride (AlN). The light-emitting element substrate 22 may also be made of materials other than aluminum nitride, for example, silicon carbide (SiC).

Cooling Member 23

The cooling member 23 is configured to have a hexagonal shape when viewed from the Z-direction in the state before the cutouts (23d, 23e), which will be described later, are formed, as shown with single-dotted chain lines in FIGS. 6 and 7.

The cooling member 23 in the present embodiment is made of copper (Cu), which has high thermal conductivity and high heat resistance temperature. The cooling member 23 may also be made of materials other than copper, for example, aluminum, which has high thermal conductivity and high heat resistance temperature.

As shown in FIG. 5, the cooling member 23 in the present embodiment is provided with the light-emitting element substrate 22 placed on the first main surface 23a. A reflective area 23c (shaded area in FIG. 5) is formed on the first main surface 23a other than the place on which the light-emitting element substrate 22 is disposed in order to reflect a portion of the heating light H1, which is emitted from the light-emitting elements 21 and reflected by the irradiated surface W1a of the workpiece W1, toward the workpiece W1 again. In the present embodiment, the reflective area 23c is an inorganic particle layer formed by applying inorganic particles so as to exhibit reflectivity to the heating light H1 emitted from the light-emitting elements 21. The inorganic particle layer is formed with materials such as zirconia ($ZrO_2$) and alumina ($Al_2O_3$).

The cooling member 23 in the present embodiment is provided with a plurality of cutouts (23d, 23e) communicating the first main surface 23a with the second main surface 23b, which is the opposite side of the first main surface 23a, as shown in FIGS. 5 to 7. The cutout 23d is provided, as shown in FIGS. 3 and 4, to form the through-hole area A1 when the heating light source modules 20 are placed on the frame 11.

The cutout 23e is provided, as shown in FIGS. 3 and 4, to form an insertion area A2 for drawing the power feeder 12 that supplies an electric current to the light-emitting elements 21 on the light-emitting element substrate 22 from the side of the second main surface 23b of the cooling member 23 to the side of the first main surface 23a on which the light-emitting element substrate 22 is disposed when the heating light source module 20 is mounted on the frame 11.

The cooling member 23 is machined to form a cooling channel 23r thereinside. Water is typically used as the cooling medium (C1, C2); however, other liquids such as fluorinated inert liquids (Fluorinert and Galden as their registered trademarks) can be used.

A method of forming the cooling member 23 having the cooling channels 23r other than machining includes that of creating 3D image data of the cooling member 23 with the cooling channels 23r inside and forming it by 3D printing.

As shown in FIG. 1, the cooling channels 23r provided in the cooling members 23 of the heating light source modules 20 are connected in parallel between the first main channel 3a and the second main channel 3b.

As shown in FIG. 7, the cooling channel 23r has a spiral shape so that the cooling medium C1 supplied from the inlet port 23p provided at the center portion of the second main surface 23b of the cooling member 23 gradually moves from the center portion of the light-emitting element substrate 22 to the circumferential edge portion thereof, when viewed from the Z-direction. In addition, as shown in FIG. 7, the cooling channel 23r is formed such that the entire channel overlaps the light-emitting element substrate 22 when viewed in the Z direction.

Figure 8A:
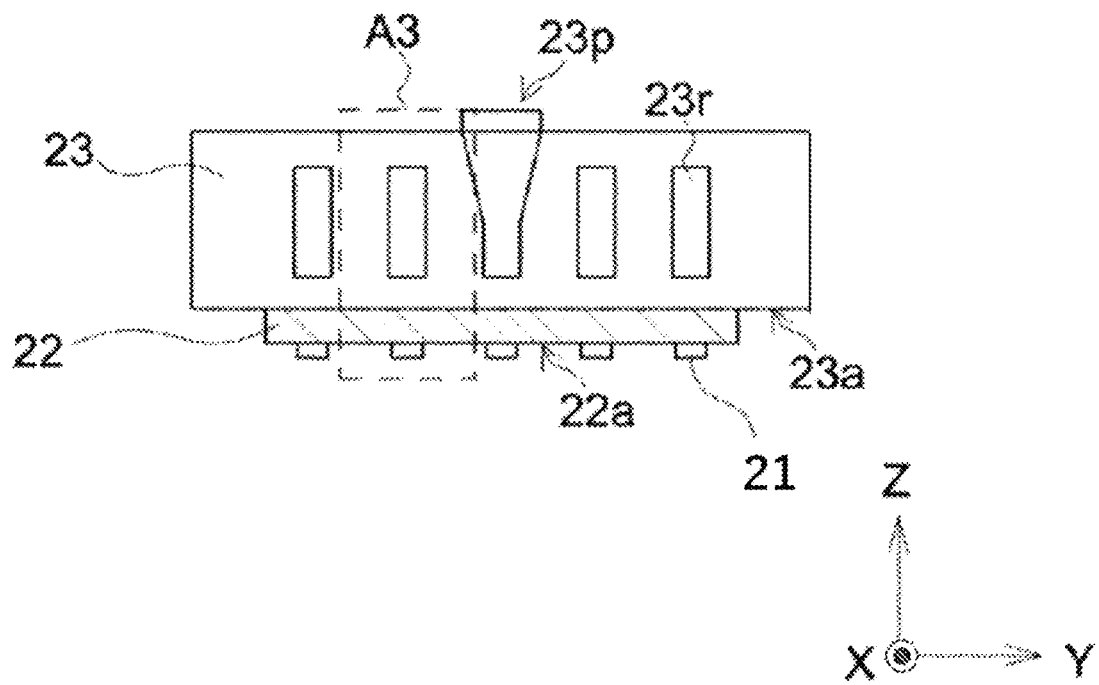
FIG. 8A is a cross-sectional view of the cooling member of the heating light source module that is cut in the YZ plane passing through the inlet port of FIG. 7.
Figure 8B:
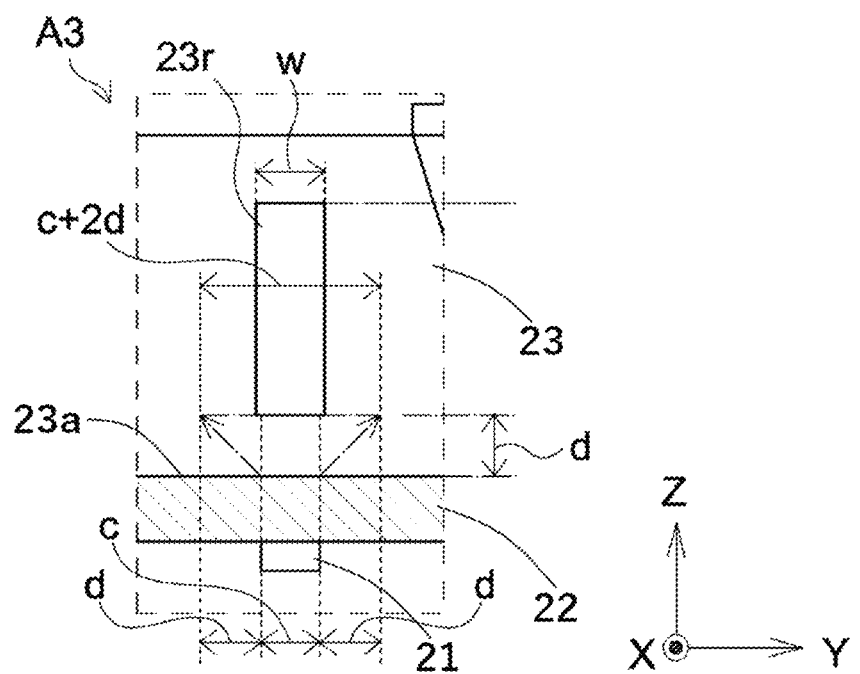
FIG. 8B is an enlarged view of the area A3 in FIG. 8A.

Here, the cooling channel 23r will be discussed in detail including its preferable shape from the viewpoint of improving its cooling performance. FIG. 8A is a cross-sectional view of the cooling member 23 of the heating light source module 20 that is cut in the YZ plane passing through the inlet port 23p. FIG. 8B is an enlarged view of the area A3 in FIG. 8A. The separation distance d between the first main surface 23a on which the light-emitting element substrate 22 is mounted and the cooling channel 23r is set to 2 mm, when viewed in the direction orthogonal to the channel cross-section of the cooling channel 23r shown in FIG. 8A (X direction in FIGS. 8A and 8B).

When the separation distance d between the first main surface 23a and the cooling channel 23r is larger, the thermal resistance is larger; when the separation distance d is smaller, the required fabrication technology is higher, increasing the cost. Hence, the separation distance d between the first main surface 23a and the cooling channel 23r is preferably between 1 mm and 3 mm, and more preferably between 1.5 mm and 2.5 mm.

The channel width w of the cooling channel 23r in the present embodiment, shown in FIG. 8b, is set to 2 mm to satisfy the above formula (1). Here, the formula (1) is restated on the following.

$$1 \text{ mm} \leq w \leq c + 2d \tag{1}$$

where c is a length of one side of the light-emitting element 21.

This light-emitting element 21 mounted on the heating light source device 10 in the present embodiment has a square shape when viewed in the Z direction; however, the light-emitting element 21 mounted thereon may have a rectangular shape when viewed in the Z direction. In this case, the value of c corresponds to the length of the longer side of the light-emitting element 21. When the light-emitting elements 21 having different sizes are mounted, the value of c is an average length of the longer sides of the respective light-emitting elements 21.

As described above, when the position of the heating light source module 20 is changed on the main surface 11b of the frame 11 in accordance with the size and shape of the workpiece W1, the corresponding cooling member 23 is also moved along with the light-emitting element substrate 22. Thus, even when the heating light source module 20 is moved on the main surface 11b of the frame 11, the light-emitting elements 21 mounted on the respective heating light source module 20 are cooled by the corresponding cooling member 23 provided in the same heating light source module 20.

Hence, the temperature of the light-emitting elements 21 arranged on the light-emitting element substrate 22 when they are lit is unlikely to vary depending upon the position of the heating light source module 20 on the main surface 11b of the frame 11, thereby enabling the light-emitting elements 21 to be lit at a desired brightness regardless of the position. In other words, this configuration makes it possible to suppress the difference in irradiance of the heating light H1 irradiated onto the workpiece W1 caused by the arrangement of the heating light source module 20, enabling the entire workpiece W1 to be heated uniformly.

The heating light source module 20 in the present embodiment is formed such that the entire cooling channel 23r overlaps the light-emitting element substrate 22 when viewed in the Z direction; however, the cooling channel 23r and the light-emitting element substrate 22 may be configured so that only a part of them overlaps when viewed in the Z direction.

In addition, in the heating light source module 20 of the present embodiment, one light-emitting element substrate 22 is mounted on one cooling member 23; however, the several light-emitting element substrates 22 may be mounted on one cooling member 23.

The cooling member 23 of the present embodiment may not be provided with the cutout 23d when, for example, the temperature of the workpiece W1 during heat treatment is measured with a thermocouple, since there is no need for forming the insertion area A2. In addition, the cooling member 23 may be formed with a through-hole that communicates the first main surface 23a of the cooling member 23 with the second main surface 23b thereof, instead of the cutout 23e, as a configuration of forming the insertion area A2.

Furthermore, in the heating light source module 20 of the present embodiment, as shown in FIG. 3, the cooling member 23 is provided with two cutouts 23e to form the insertion areas A2 for separately inserting the two power feeders (12, 12), which are connected to a pair of the electrodes (22b, 22b), respectively; however, only one cutout 23e may be provided in the cooling member 23 to form one insertion area A2, through which two power feeders (12, 12) may be inserted.

Moreover, the cooling member 23 may not be provided with the cutout 23d and the through-hole when, for example, a space for passing through the power feeders 12 is allocated between the heating light source modules 20 mounted on the frame 11 since there is no need to form the insertion area A2.

In addition, in the present embodiment, one cooling member 23 is formed with one inlet port 23p, one outlet port 23q, and one cooling channel 23r; however, one cooling member 23 may be formed with a plurality of the inlet ports 23p, a plurality of the outlet ports 23q, and a plurality of the cooling channels 23r.

Another Embodiment

Hereinafter, another embodiment will be described.

Figure 9:
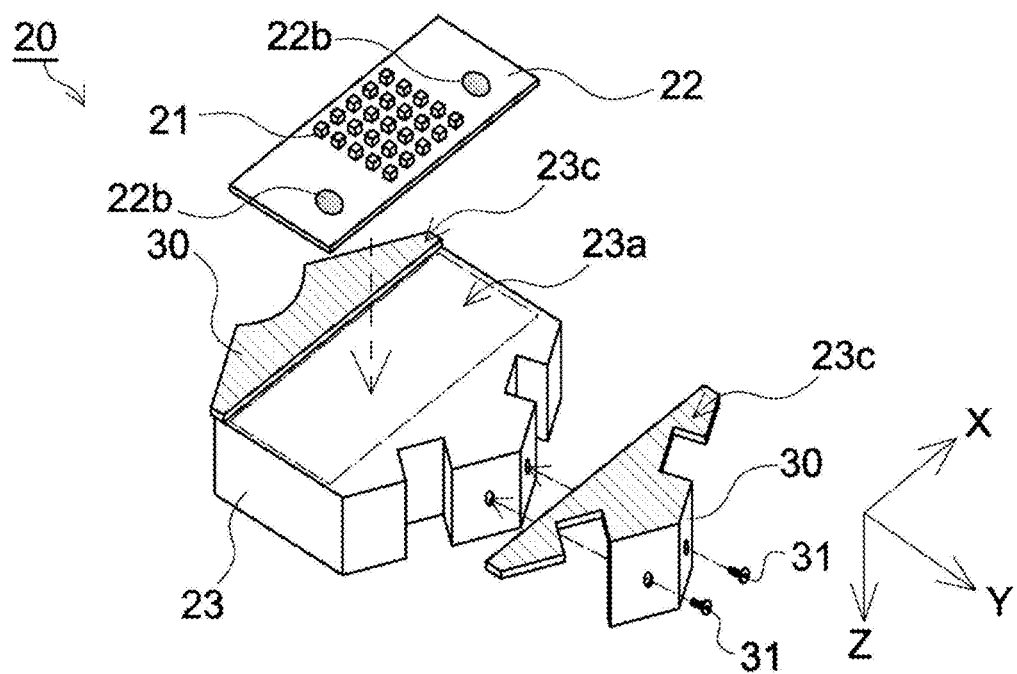
FIG. 9 is an overall perspective view schematically illustrating another embodiment of a heating light source module.

<1> FIG. 9 is an overall perspective view schematically illustrating another embodiment of a heating light source module 20. As shown in FIG. 9, the heating light source module 20 of the present embodiment may be formed with the reflective area 23c by mounting a reflective member 30 that is detachable to the cooling member 23 using fixed screws 31.

The above configuration allows the reflective member 30 to be detached or attached from part of the heating light source modules 20. The above configuration makes it possible to determine the area in which light reflected toward the heating light source module 20 side by the irradiated surface W1a of the workpiece W1 is reflected again toward the irradiated surface W1a of the workpiece W1, and the area in which the light is not reflected again toward the irradiated surface W1a of the workpiece W1. Hence, when the workpiece W1 has an area having a lower temperature, light reflected on the irradiated surface W1a of the workpiece W1 is reflected by attaching the reflective member 30 so as to have the light act as heating light again. In contrast, when the workpiece W1 has an area having a higher temperature, the light is not reflected toward the workpiece W1 by detaching the reflective member 30. In other words, the reflective members 30 are appropriately configured to control the light reflected on the irradiated surface W1a of the workpiece W1 whether the light is reflected toward the workpiece W1 or not. Therefore, the configuration allows the temperature distribution of the entire workpiece W1 to be finely tuned, performing heat treatment of the workpiece W1 with improved uniform temperature distribution during heat treatment.

Figure 10A:
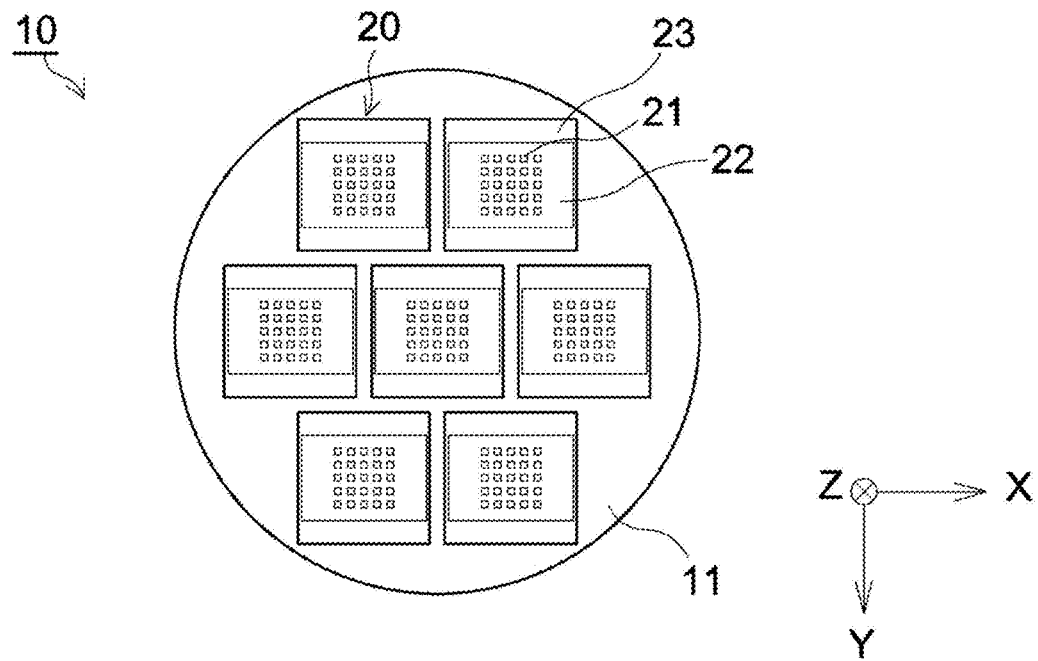
FIG. 10A is a schematic drawing of a configuration of a heating light source device of another embodiment when viewed from the −Z side.
Figure 10B:
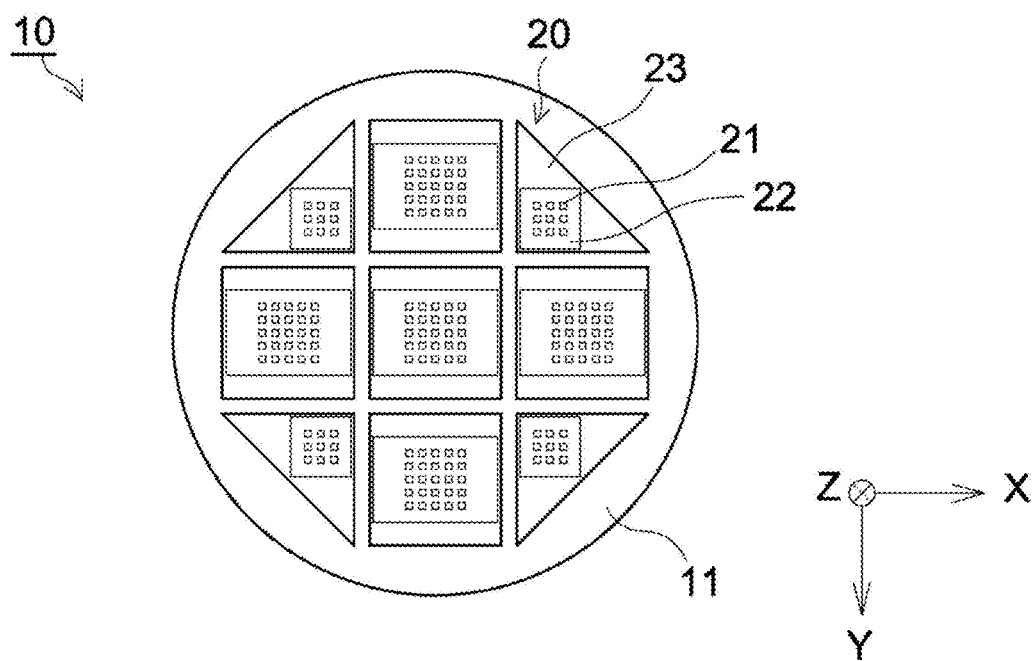
FIG. 10B is a schematic drawing of a configuration of a heating light source device of yet another embodiment when viewed from the −Z side.
Figure 10C:
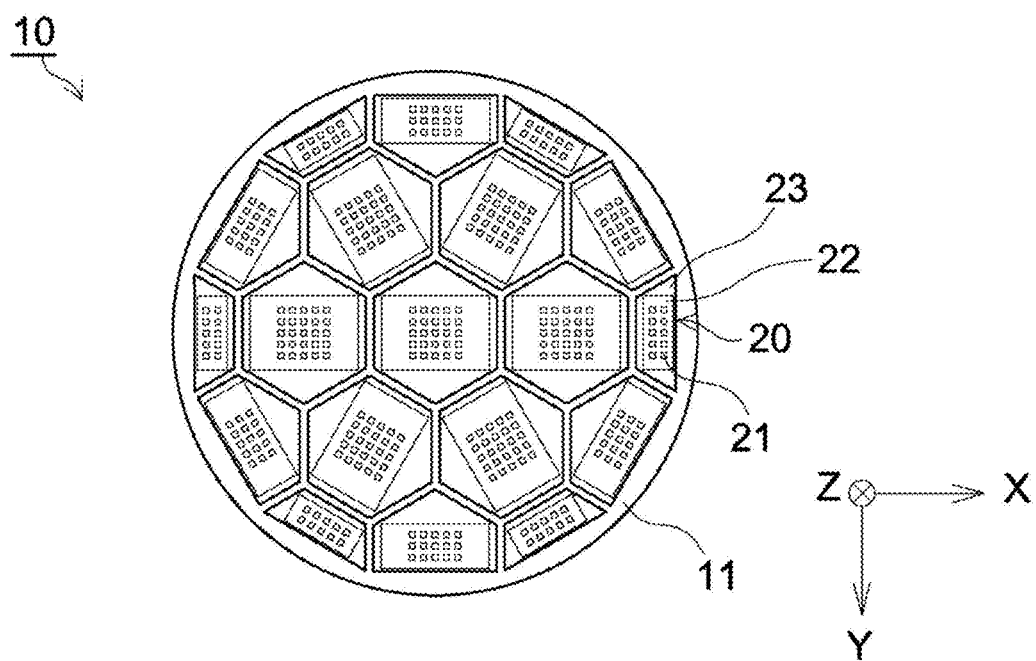
FIG. 10C is a schematic drawing of a configuration of a heating light source device of yet another embodiment when viewed from the −Z side.

<2> FIGS. 10A to 10C are schematic drawings of a configuration of a heating light source device of another embodiment when viewed from the −Z side. For the convenience of explanation, FIGS. 10A to 10C are schematically illustrated such that the power feeders 12 and the electrodes 22b are not shown and the cutouts (23d, 23e) are not provided in the cooling member 23.

FIG. 10A shows a configuration of a heating light source device 10 that is provided with the heating light source modules 20, each of the heating light source modules 20 having a square (rectangular) shape when viewed in the Z direction. FIG. 10B shows a configuration of the heating light source device 10 that is provided with a combination of the heating light source modules 20, each module having a square (rectangular) shape or a triangle shape when viewed in the Z direction. FIG. 10C shows a configuration of the heating light source device 10 that is provided with a combination of the heating light source modules 20, each module having a square (rectangular) shape, a pentagonal shape or a hexagonal shape when viewed in the Z direction.

From the viewpoint of reducing the cost of manufacturing the heating light source device 10, the heating light source device 10 is preferably configured to be composed of the heating light source modules 20 with the same shape rather than those with different shapes.

In particular, as shown in FIG. 10C, the heating light source device provided with a combination of the heating light source modules 20 that are different polygonal shapes to suit the shape of the frame 11, allows the light-emitting elements 21 to be arranged closely, enabling the heating light H1 with higher irradiance to be irradiated onto the irradiated surface W1a of the workpiece W1. Although the arrangement patterns of the heating light source modules 20 that are triangular, quadrangular, pentagonal, and hexagonal when viewed in the Z direction have been described so far, other polygonal shapes of the heating light source modules 20 may be mounted.

<3> The configurations of the above optical heating system 1, the heating light source device 10 and the heating light source module 20 are merely examples; the present invention is not limited to each of the configurations described above and shown in the drawings.

What is claimed is:
1. A heating light source device comprising:
a plurality of heating light source modules;
each of the heating light source modules further comprising;
a light-emitting element substrate having a placement surface and a back side surface, the back side surface being opposite to the placement surface;
a plurality of light-emitting elements mounted on the placement surface of the light-emitting element substrate; and
a cooling member having a first main surface on which the light-emitting element substrate is disposed and is in contact with the back side surface of the light-emitting element substrate, and a second main surface that is located opposite to the first main surface; the cooling member further comprising;
a cooling channel that is formed inside the cooling member for communicating cooling medium for cooling the light-emitting elements on the light-emitting element substrate;
an inlet port for introducing the cooling medium into the cooling channel; and
an outlet port for discharging the cooling medium from the cooling channel of the cooling member;
wherein the cooling channel has a spiral shape for gradually forming from a center portion side of the light-emitting element substrate to a circumferential edge portion side thereof when viewed from a direction orthogonal to the first main surface of the cooling member, wherein the cooling channel has a channel width that satisfies the following formula (1) when viewed from a direction orthogonal to the first main surface of the cooling member:

$$1\ mm < w < c + 2d \tag{1}$$

where w is the channel width, c is an average length of the longer sides of the plurality of the light-emitting elements, and d is a separation distance between the first main surface of the cooling member and the cooling channel with respect to a direction orthogonal to the first main surface of the cooling member.

2. The heating light source device according to claim 1, wherein the cooling member further comprises a cutout or a through hole that communicates the first main surface with the second main surface with at least one location; and
the heating light source module further comprises a power feeder through which the light-emitting elements are powered, the power feeder being inserted through the cutout or the through hole.

3. The heating light source device according to claim 1, further comprising a frame having a main surface on which the plurality of the heating light source modules are mounted; and
an adjustment mechanism that adjusts at least either of a position of the light-emitting element substrate in a direction orthogonal to the main surface of the frame and a tilt angle of the placement surface of the light-emitting element substrate relative to the main surface of the frame.

4. The heating light source device according to claim 1, wherein the cooling member is configured to have a triangular shape, a quadrangular shape, a pentagonal shape, or a hexagonal shape when viewed from a direction orthogonal to the first main surface of the cooling member.

5. The heating light source device according to claim 1, wherein the cooling member includes a reflective area that is formed at least on a part of the first main surface of the cooling member, other than the place on which the light-emitting element substrate is mounted.

6. The heating light source device according to claim 5, wherein the reflective area is formed with an inorganic particle layer.

7. The plurality of heating light source module that is mounted on the heating light source device according to claim 5.

8. The heating light source device according to claim 1, wherein the cooling channel is configured such that the entire cooling channel faces the light-emitting element substrate with respect to a direction orthogonal to the first main surface of the cooling member.

9. The plurality of heating light source modules that is mounted on the heating light source device according to claim 1.

10. An optical heating system comprising:
a chamber that accommodates a workpiece;
a supporter that supports the workpiece in the chamber; and
the heating light source device according to claim 1, the heating light source device that emits heating light and that is disposed such that the heating light is irradiated onto an irradiated surface of the workpiece.

11. The optical heating system according to claim 10, wherein the supporter includes a rotation mechanism that rotates the workpiece around an axis passing through the center of the supporter in a direction orthogonal to the irradiated surface of the workpiece.

12. The optical heating system according to claim 10, wherein the separation distance d between the first main surface of the cooling member and the cooling channel is less than 2.5 mm.

* * * * *